Figure 1:
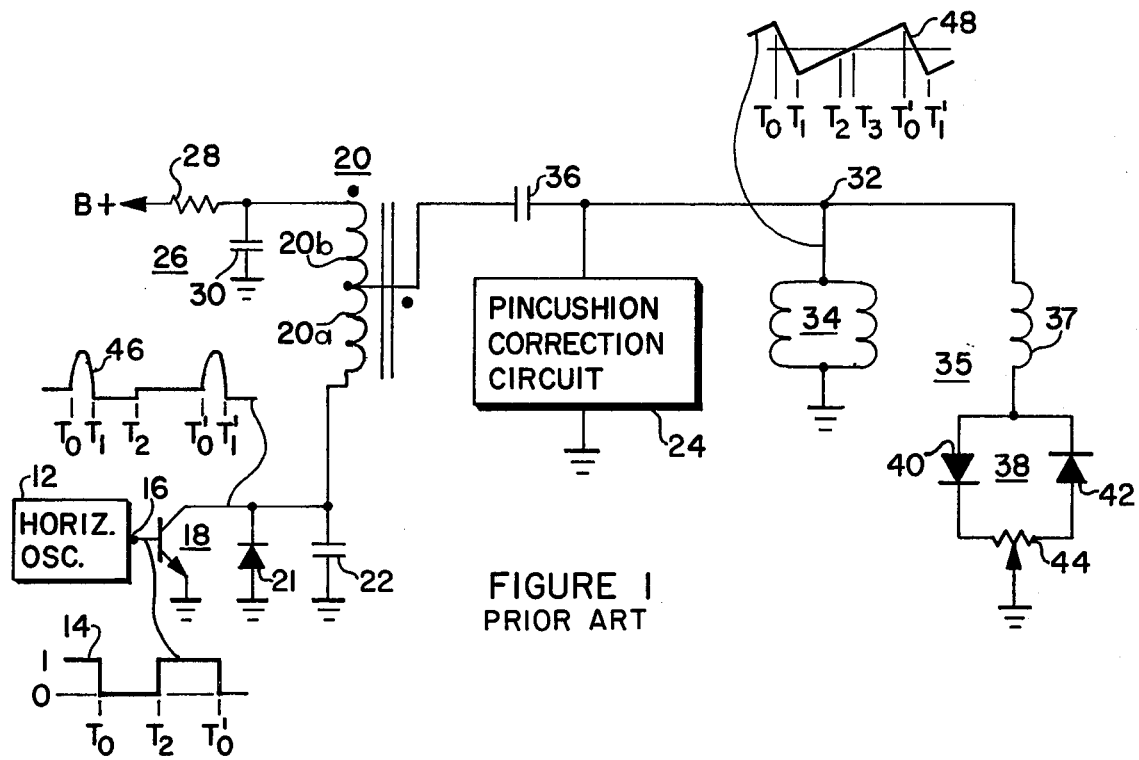

United States Patent [19]
Haferl

[11] 3,980,927
[45] Sept. 14, 1976

[54] DEFLECTION CIRCUIT

[75] Inventor: Peter Eduard Haferl, Adliswil, Switzerland

[73] Assignee: RCA Corporation, New York, N.Y.

[22] Filed: Feb. 10, 1975

[21] Appl. No.: 548,183

[30] Foreign Application Priority Data
Dec. 20, 1974 United Kingdom............... 55149/74

[52] U.S. Cl................................. 315/399; 315/398
[51] Int. Cl.² .................... H01J 29/70; H01J 29/76
[58] Field of Search ............ 315/370, 397, 398, 399

[56] References Cited
UNITED STATES PATENTS

| | | | |
|---|---|---|---|
| 2,713,652 | 7/1955 | Baylor................................ | 315/398 |
| 2,871,405 | 1/1959 | Vonderschmitt................... | 315/399 |
| 3,489,948 | 1/1970 | Buechel............................. | 315/398 |
| 3,628,082 | 12/1971 | Dietz................................. | 315/370 |
| 3,769,542 | 10/1973 | Pieters.............................. | 315/399 |
| 3,824,427 | 7/1974 | McLeod, Jr. ..................... | 315/399 |

Primary Examiner—Maynard R. Wilbur
Assistant Examiner—T. M. Blum
Attorney, Agent, or Firm—Eugene M. Whitacre; Paul J. Rasmussen

[57] ABSTRACT

A deflection circuit wherein coupling capacitors are placed in series with the transformed yoke impedance to reduce capacitance values and voltage ratings of these capacitors. One of the coupling capacitors also serves to integrate a centering current developed by a centering circuit, thereby providing for a relatively uniform direct current component through the yoke windings throughout each horizontal line of scan.

4 Claims, 2 Drawing Figures 3,980,927

DEFLECTION CIRCUIT

BACKGROUND OF THE INVENTION

This invention relates to a transistor deflection circuit for a television receiver.

Solid state television receivers have generally utilized either silicon controlled rectifiers (SCR's) or transistors to provide switching necessary to develop a varying current magnitude in a winding of a deflection yoke utilized in conjunction with a kinescope to provide electrode beam deflection. These television receivers have utilized both saddle and toroidal yoke designs. The toroidal yokes have many advantages over the saddle yokes, however, toroidal yokes are, generally, of a lower impedance than saddle yokes.

SCR deflection systems are ideally suited for use with toroidal yokes because of their power switching characteristics but are, generally, more complex than transistor deflection systems of the same deflection power-deliverying capability.

Currently there are no practical deflection transistors available which will switch the currents required to be supplied to toroidal yokes utilized with large deflection angle (e.g. 110°) kinescopes during the trace portion of the deflection cycle while not breaking down under voltages developed during the retrace portion of the deflection cycle. However, by transforming the toroidal yoke impedance to a higher impedance, currently available transistors can be made to operate within limit specifications.

Deflection circuit designs utilizing transistors in conjunction with transformed yoke impedances have placed high capacitance and high current type capacitors required to establish the shape of the trace portion of the deflection cycle directly in series with the yoke. Also, the power supply providing B+ to this type deflection circuit generally requires high capacitance and high voltage type capacitors.

When an adjustment for centering of the raster on the face of the kinescope is required, a centering network comprising non-symmetrical components and a current integration inductor has been coupled in parallel with the yoke in order to create an adjustable magnitude and polarity direct current through the yoke during the trace portion of the deflection cycle. It would be desirable to reduce the complexity and cost of such a centering circuit.

SUMMARY OF THE INVENTION

A deflection circuit in accordance with the invention comprises a transformer including first, second and third magnetically coupled windings and a first capacitor. Switching means coupled to the first winding and the first capacitor develops a flux field in the first winding and provides bypassing of the first capacitor during a trace portion of a deflection cycle and provides for a collapse of the flux field during a retrace portion of the deflection cycle. Means include a second capacitor, the second winding and the third winding in a series combination. The means is coupled in parallel with the first capacitor. A deflection winding is coupled in parallel with the third winding.

Figure 2:
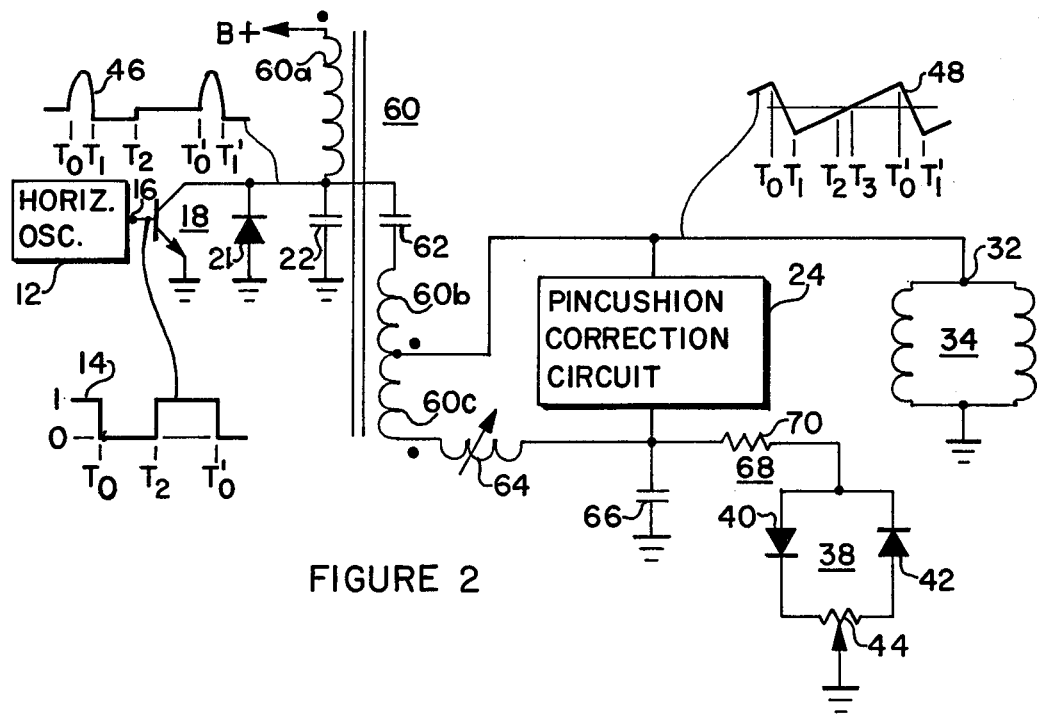

A more detailed description of the preferred embodiment of the invention is given in the following detailed description and accompanying drawings of which:

FIG. 1 is a schematic diagram, partially in block form, of a prior art deflection circuit; and FIG. 2 is a schematic diagram, partially in block form, of a deflection circuit according to the invention.

DESCRIPTION OF THE INVENTION

FIG. 1 is a schematic diagram, partially in block form, of a prior art deflection circuit. A horizontal oscillator 12 produces deflection drive signals 14 at an output terminal 16. The output terminal 16 is coupled to the base electrode of a horizontal output transistor 18. The emitter electrode of transistor 18 is coupled to reference potential and the collector electrode is coupled to a first terminal of a winding 20a of a horizontal output transformer 20, to the cathode electrode of a damper diode 21 and to a first terminal of a retrace capacitor 22. The other terminal of retrace capacitor 22 and the anode of diode 21 are coupled to reference potential.

A second terminal of winding 20a is coupled to a first terminal 32 of a set of deflection yoke windings 34 by means of a first trace capacitor 36. The other terminal of the set of yoke windings 34 is coupled to reference potential. A centering circuit 35 comprising a current integration inductor 37 and a non-symmetrical current conduction network 38 is coupled in parallel with yoke windings 34 to provide for a controllable non-symmetrical conduction of current through capacitor 36, thereby developing a desired polarity and magnitude of direct current through yoke windings 34. The non-symmetrical network 38 comprises a diode 40, a diode 42, and a potentiometer 44 coupled in a manner which provides for an adjustment of the relative magnitudes of current flowing in each of two directions through the inductor 37.

The second terminal of winding 20a is also coupled to a first terminal of a winding 20b of horizontal output transformer 20. A second terminal of winding 20b is coupled to a source of direct current potential (B+) by means of a low-pass filter 26 comprising a current source resistor 28 and a second trace capacitor 30. Even though the inductance of windings 20a and 20b have been chosen to be approximately equal in this embodiment, it will be understood that other ratios of inductance may be used to provide for a matching of the particular characteristics of transistor 18 and yoke 34. Also, the windings 20a and 20b are polarized as indicated by the polarizing dots. The first trace capacitor 36 and the second trace capacitor 30 are coupled to windings 20a and 20b and yoke windings 34 to form a resonant circuit tuned to a frequency which will provide for the desired current waveform through the yoke windings during the trace portion of the deflection cycle.

A pincushion correction circuit 24 is coupled between terminal 32 of yoke windings 34 and reference potential. The pincushion correction circuit 24 coupled in this manner provides for a variation of the current through the yoke windings 34, for example, at a vertical rate, thereby reducing pincushion distortion in a horizontal direction.

In operation during the interval $T_0 - T_2$ as shown in waveform 14 the transistor 18 is placed in cut off due to a lack of drive signal (logic 0) from the horizontal oscillator 12. Deflection drive signal (logic 1) produced at output terminal 16 of horizontal oscillator 12 during the interval $T_2 - T_0'$ supply base-emitter currents sufficient to provide for saturation of transistor 18 during the second half of the trace portion of the deflection cycle ($T_3 - T_0'$) shown in current waveform 40.

It will be assumed that the horizontal oscillator has been producing deflection drive signals and B+ has been applied to the deflection circuit for a number of cycles prior to $T_0$. Also initially the effect of the pincushion correction circuit 24 will be disregarded to simplify the explanation of the operation of the deflection circuit.

Just prior to $T_0$ the transistor 18 is conducting heavily resulting in a current flow from the junction of windings 20a and 20b through the winding 20a to reference potential through transistor 18. Due to the choice of equal inductance in windings 20a and 20b and the coupling therebetween, the current flow into the junction of windings 20a and 20b is approximately twice the current flow through winding 20a, and the current in winding 20b equals the current in winding 20a. The current flow, however, through winding 20b is from the junction of the winding 20a and 20b through winding 20b to the B+ via low-pass filter 26.

The current flowing into the common connection of windings 20a and 20b flows from reference potential through two parallel paths, one being the set of yoke windings 34, the other being centering circuit 35. This combined current flows from the terminal 32 through capacitor 36 to the common connection of windings 20a and 20b. The current flow through the centering circuit 35 provides for an accumulation of a direct current charge on the capacitor 36 thereby providing for direct current flow through the yoke windings 34 resulting in a centering of the raster within the viewable portion of the kinescope face (not shown).

At $T_0$ the transistor 18 is turned off by a transition from a logic 1 to a logic 0 at the base electrode of transistor 18 as shown in waveform 14. The energy stored in the yoke windings 34 and in the windings 20a and 20b of the horizontal output transformer 20 rings out at a frequency determined essentially by the yoke and transformer inductance and the retrace capacitor 22 thereby producing a retrace voltage pulse at the collector electrode of transistor 18, as shown in a waveform 46.

At $T_1$ the polarity of the voltage at the collector electrode of transistor 18 goes slightly negative as the damper diode 21 becomes conductive. The current in the set of yoke windings 34, as shown in waveform 48, makes the transition from a maximum positive current to a maximum negative current during the interval $T_0 - T_1$. The current flowing through the diode 21 flows through winding 20q to the junction of windings 20a and 20b. Approximately twice the amount of current flowing through winding 20a flows through capacitor 36 and through the parallel combination of the yoke windings 34 and the centering circuit 35. Therefore, the current flowing in winding 20b is approximately equal to the current flowing through winding 20a and flows from the capacitor 30 to the junction of windings 20a and 20b.

The negative current flowing through yoke windings 34 diminishes in magnitude until reaching $T_3$ as shown in waveform 48. At $T_2$ deflection drive signals at output terminal 16, as shown in waveform 14, make a transition from a logic 0 to a logic 1 providing for base-emitter current drive to the transistor 18 sufficient to support collector-emitter current conduction during the interval $T_3 - T_0'$ as shown in waveform 48.

FIG. 2 is a schematic diagram, partially in block form, of a deflection circuit according to the invention. Items which serve the same function as those items detailed in FIG. 1 are identified with the same numbers in FIG. 2.

An output terminal 16 of a horizontal oscillator 12 is coupled to the base electrode of a horizontal output transistor 18. The emitter electrode of transistor 18 is coupled to reference potential and the collector electrode is coupled to a first terminal of a winding 60a of a horizontal output transformer 60, to the cathode electrode of a damper diode 21, to a first terminal of a retrace capacitor 22 and to a first terminal of a first trace capacitor 62. Another terminal of retrace capacitor 22 and the anode of diode 21 are coupled to reference potential. A second terminal of winding 60a is coupled to B+.

Another terminal of capacitor 62 is coupled to a first terminal of a winding 60b. A second terminal of winding 60b is coupled to a first terminal of a winding 60c and a first terminal 32 of the set of yoke windings 34. Another terminal of the set of yoke windings 34 is coupled to reference potential. A second terminal of winding 60c is coupled to a first terminal of a width inductor 64. A second terminal of the width inductor 64 is coupled to reference potential by means of a parallel combination of a second trace capacitor 66 and a centering circuit 68. The centering circuit 68 comprises a series combination of a current limiting resistor 70 and a non-symmetrical conduction network 38. The non-symmetrical conduction network 38 comprises a diode 40, a diode 42, and a potentiometer 44 coupled in a manner which provides for an adjustment of the relative magnitudes of current flowing in each of the two directions through the resistor 70. The windings 60a, 60b, and 60c are polarized as indicated by the polarizing dots. Although the deflection circuit is shown with the width inductor 64, it may be understood that this inductor is not necessary to the operation of the circuit and, therefore, may be omitted. The first trace capacitor 62 and the second trace capacitor 66 are coupled to the windings 60b and 60c and yoke windings 34 to form a resonant circuit tuned to a frequency which will provide for the desired current waveform through the yoke windings during the trace portion of the deflection cycle.

The pincushion correction circuit 24 is coupled between the first terminal of winding 60c and the junction of inductor 64 and capacitor 66. Pincushion correction circuit 24 coupled in this manner provides for a variation of the current through the yoke windings 34, for example, at a vertical rate, thereby reducing the pincushion effect resulting from the variation in deflection angle required in different horizontal planes in the deflection field.

In operation deflection drive signals produced at an output terminal 16 of horizontal oscillator 12, shown in waveform 14, control the conduction of transistor 18 in a manner described in conjunction with FIG. 1. As in FIG. 1 it will be assumed that the horizontal oscillator has been producing deflection drive signals and B+ has been applied to the deflection circuit for a number of cycles prior to $T_0$. Also initially the effect of the pincushion correction circuit 24 will be disregarded to simplify the explanation of the operation of the deflection circuit.

Just prior to $T_0$ the transistor 18 is conducting heavily resulting in a current flow from B+ through winding 60a and the transistor 18 to reference potential. Also current flows from the junction of windings 60b and 60c through winding 60b, capacitor 62, and transistor 18 to reference potential. Due to the choice of equal inductance in windings 60b and 60c, the current flow into the junction of windings 60b and 60c is approximately twice the current flow through winding 60b and the current in winding 60c equals the current in winding 60b. The current flow, however, through winding 60c is from the junction of the winding 60b and 60c through winding 60c and the parallel combination of the capacitor 66 and the centering circuit 68. The current flowing into the junction of winding 60b and 60c flows from reference potential through the yoke windings 34. The current flow through the centering circuit 68 provides for an accumulation of a direct current charge on the capacitor 66, thereby providing for a direct current flow through the winding 60c and the yoke windings 34 to reference potential. This current flow results in a centering of the raster within the viewable portion of the kinescope face (not shown).

At $T_0$ the transistor 18 is turned off by a transition from a logic 1 to a logic 0 at the base electrode of transistor 18 as shown in waveform 14. The energy stored in the yoke windings 34 and in windings 60a, 60b, and 60c of the horizontal output transformer 60 rings out at a frequency determined by the circuit inductance and retrace capacitor 22. The voltage transition at the collector electrode of transistor 18 is shown in waveform 46. At $T_1$ the polarity of the voltage at the collector electrode of transistor 18 goes slightly negative as the damper diode 21 becomes conductive. The current in the yoke windings 34 as shown in waveform 48 makes the transition from a maximum positive current to a maximum negative current during the interval $T_0 - T_1$. The current flowing through diode 21 flows through winding 60a to B+ and through capacitor 62 and winding 60b to the junction of windings 60b and 60c. Approximately twice the amount of current flowing through winding 60b flows through the yoke windings 34 to reference potentials. Therefore, the current flowing in winding 60c is approximately equal to the current flowing through winding 60b and the parallel combination of capacitor 66 and centering circuit 68.

The negative current flowing through yoke windings 34 diminishes in magnitude until reaching $T_3$ as shown in waveform 48. At $T_2$ deflection drive signals at output terminal 16 of horizontal oscillator 12, as shown in waveform 14, make the transition from a logic 0 to a logic 1 providing for base-emitter current drive to the transistor 18 sufficient to support collector-emitter current conduction during the interval $T_3 - T_0'$ as shown in waveform 48.

As can be seen from the above description, the maximum current to which the capacitor 62 is subjected is approximately one-half of the maximum current to which capacitor 36 of FIG. 1 is subjected. Also, since capacitor 62 is placed in series with the transformed yoke impedance rather than directly in series with the yoke windings, the capacitance value of capacitor 62 will be approximately one-fourth the capacity value of the capacitor 36 of FIG. 1 to obtain the same trace characteristics.

Capacitor 66, while being approximately the same capacity value as capacitor 30 of FIG. 1, is subjected only to DC potential generated by the centering circuit as compared to capacitor 30 of FIG. 1 which is subjected to B+. Hence, the deflection circuit arrangement according to the invention provides a substantial cost saving because of the lesser parameter requirements of the capacitors.

In addition, due to the integrating characteristics of the capacitor 66, the DC current through winding 60c and yoke windings 34 is sustained throughout the deflection period without the need of a current integrating inductor 36 required in the deflection circuit of FIG. 1, resulting in a further cost saving.

What is claimed is:
1. A deflection circuit comprising:
   a transformer including first, second and third magnetically coupled windings;
   a first capacitor;
   switching means coupled to said first winding and said first capacitor for developing a flux field in said first winding and for providing bypassing of said first capacitor during a trace portion of a deflection cycle and for providing for a collapse of said flux field during a retrace portion of said deflection cycle;
   means including a second capacitor, said second winding and said third winding in a series combination, said means being coupled in parallel with said first capacitor; and
   a deflection winding coupled in parallel with said third winding.

2. A deflection circuit according to claim 1 wherein said means includes a third capacitor, said third capacitor being coupled adjacent said third winding, said deflection winding thereby being in series combination with said third capacitor and said third winding.

3. A deflection circuit according to claim 2 wherein said means includes a centering means coupled in parallel with said third capacitor for developing a direct current potential on said third capacitor for direct current biasing said deflecting windings.

4. A deflection circuit according to claim 3 and further comprising a pincushion correction means coupled in parallel with said third winding for modulating the deflection current through said deflection windings at a predetermined frequency rate.

* * * * *

Disclaimer 3,980,927.—*Peter Eduard Haferl*, Adliswil, Switzerland. DEFLECTION CIRCUIT. Patent dated Sept. 14, 1976. Disclaimer filed Feb. 24, 1981, by the assignee, *RCA Corp.*

Hereby enters this disclaimer to claims 1, 2, 3 and 4 of said patent.
[*Official Gazette May 19, 1981.*]